Aug. 19, 1969 G. E. GORGENYI 3,462,349

METHOD OF FORMING METAL CONTACTS ON ELECTRICAL COMPONENTS

Filed Sept. 19, 1966

INVENTOR.
GEZA E. GORGENYI,
BY
W H. McAllister Jr
ATTORNEY.

3,462,349

METHOD OF FORMING METAL CONTACTS ON ELECTRICAL COMPONENTS

Geza E. Gorgenyi, Santa Ana, Calif., assignor to Hughes Aircraft Company, Culver City, Calif., a corporation of Delaware Filed Sept. 19, 1966, Ser. No. 580,272
Int. Cl. C23b 5/50, 5/66
U.S. Cl. 204—15 9 Claims

ABSTRACT OF THE DISCLOSURE

The method for forming electrical contacts in the form of metallic bumps by electroplating such bumps through an opening in an electrically insulating film such as the photoresist, the electroplating action being discontinued and portions of the photoresist being removed around the bump formed at this point, after which the electroplating is continued which results in closing or filling in the gap which normally would occur under the bump.

Figure 1:
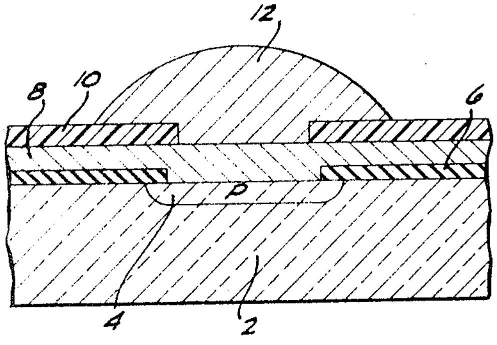

This invention relates to methods for forming electrical contacts in the form of metallic bumps to electrical components such as electrically interconnecting substrates or mounts and semiconductor devices such as transistors and the like.

Considerable difficulty has been encountered in making electrical contacts, particularly of the low resistance non-rectifying type, to solid state circuit elements and components and especially for such as those employed in integrated and microelectronic circuits where size and working area are extremely small and often well within the microscopic range. In some instances it has been desirable to provide several electrical connections to devices as small as 10 microns in diameter, for example. It will thus be understood that the shaping and exact alignment of such contacts is a tedious and extremely exacting procedure.

In the co-pending application of K. H. Reissmueller, R. E. Alexander, and M. W. Reissmueller, Ser. No. 511,780 filed Dec. 6, 1965 and now Patent No. 3,408,271, and assigned to the instant assignee, a method of forming such electrical contacts in the form of plated metallic and solderable bumps is described. The component to be provided with such "bump contacts" may be a planar transistor device or an insulating substrate or "chip" of glass having a plurality of discrete electrically conductive paths bonded to a surface thereof to each of which paths it is desired to provide a solderable metallic bump. According to the method described in the aforementioned co-pending application, the component surface on which the conductive paths are located is first provided by a readily removable overall layer of metal as by vapor deposition. This step, of course, results in electrically shorting all of the conductive paths to each other. The next step is to provide an electrically insulating coating of conventional photoresist material, for example, through which coating openings are made to expose preselected portions of the underlying conductive paths to which it is desired to form the bump contacts. Using the over-all deposited metal layer or "web" as a plating electrode, the component is then subjected to an electroplating process which results in forming or "growing" bumps only on the exposed preselected portions of the conductive paths. Thereafter the insulating coating which protected the component against electroplating is removed by conventional techniques and the plating layer or web is removed by conventional etching techniques or even by means of a high velocity water spray. This latter technique is possible because of the rather loose adherence of the vapor-deposited metal to the nonmetallic portions of the substrate surface.

In this process, it has been observed that the metallic bump first "grows" vertically during electroplating up through the opening in the insulating coating and after reaching the top of such opening begins to grow laterally as well as vertically as the bump is built up to the desired height. The bumps thus formed have more or less the shape of a mushroom with the overhanging portions thereof being disposed over the insulating coating. Upon removal of the insulating coating, a gap exists under the overhang or flange of the plated bumps which gap may be several microns high, rendering subsequent sealing of the surface of the component around the metallic bumps as with glass, for example, without discontinuities rather difficult.

It is therefore an object of this invention to provide an improved method for making electrical contacts to electrical components.

A further object of the invention is to provide an improved method for making plated electrical contacts to electrical components which contacts may be effectively sealed around their peripheries.

Another object of the invention is to provide an improved method for making plated electrical contacts to electrical components without forming or leaving discontinuities or gaps between the surface of such components and overhanging portions of the contacts.

These and other objects and advantages of the invention are realized by forming the desired electrical contacts or bumps as described to a predetermined height. Thereafter at least portions of the insulating coating through which the contact bumps were initially formed surrounding the bumps and/or under the overhang thereof are removed while leaving an annular gap or ring therein around each bump. Alternatively, the entire insulating coating is removed and a new one applied to leave a gap or ring therein around each bump. Plating of the bumps is then continued which results in closing or filling in the gas underneath the bump overhang with metal. Thereafter, the insulating coating and plating web are removed as before.

The method of the invention will be described in greater detail by reference to the drawings in which:

FIGURES 1 through 5 are successive cross-sectional, elevational views of a portion of a semiconductor device illustrating the formation of an electrical contact or bump to one region thereof.

With reference now to FIGURE 1, a portion of a semi-conductor device such as a transistor is shown which device has been fabricated in a semiconductor body or wafer 2 according to techniques well known in the art. It should be understood that it is customary to make many hundreds of such devices on a relatively large semiconductor wafer by means of oxide-masking and diffusion techniques known in the art and amply described in such patents as 2,802,760 to Derick et al., and 3,025,589 to Hoerni. After fabrication of the devices, the semiconductor wafer is sliced up so as to yield a plurality of discrete devices. Hence, while the description of the practice of the method of the present invention is with respect to only a single device, and only a portion of that device is shown, the process of the invention is usually and advantageously practiced upon a semiconductor body containing many hundreds of devices prior to slicing the wafer to yield discrete devices. It is possible to practice the process of the invention on only a single device if desired. Also, while the process of the invention is described herein with particular reference to semiconductor devices such as transistors, the process may be practiced to equal advantage in fabricating over electrical or electronic components including integrated or printed circuitry assemblies which may comprise no more than a plurality of discrete conductive paths disposed on an electrically insulating substrate.

In FIGURE 1, a body 2 of silicon for example is shown the bulk of which may constitute a region of N-type conductivity serving as the collector of an N-P-N transistor, for example. By means of the aforementioned masking and diffusion techniques, a diffused region 4 of P-type conductivity is formed and disposed on a surface of the silicon body 2. The region 4 may serve as a base or emitter of the transistor, for example, it being understood that there may be several such regions of different conductivity types in a transistor device to which regions discrete electrical connections are necessary. The surface to which the junctions formed between adjacent regions of opposite conductivity extend is usually protected by a layer 6 of insulating material which extends over the entire surface of the device body 2. This insulating layer 6 is customarily bonded to this surface and left permanently in place after it has also been utilized in the fabrication of the device. The insulating layer 6 may be glass, for example, or an oxide of the material constituting the semiconductor body, in this case silicon oxide. As suggested, supra portions at least of this insulating layer 6 may be formed of the mask material utilized to fabricate the underlying region 4 by diffusion and left in place. It is customary after forming the last diffused region, such as the region 4 in the instant example, to oxidize the exposed surface of this region so that the entire surface of the semiconductor body is protected before and while awaiting further processing. It is within the scope of the present invention to apply additional insulation over the masking and protective layer 6 such as pyrolytically deposited silicon oxide or glass. Reference numeral 6 is therefore intended to indicate generically all such types and forms of surface-protecting insulation.

It is therefore usually necessary to provide openings through the protective insulating layer 6 to at least partially expose surfaces of the underlying regions in order to provide electrical connections to these regions. Such an opening is thus shown through the insulating layer 6 in the present example to expose a portion of the underlying P-type diffused region 4. Such openings may be provided by means of photoresist and etching procedures well known in the art. After the desired underlying regions are thus exposed, the photoresist material used to form these openings is completely removed from the surface of the semiconductor body 2 and except for these openings, the surface of the body 2 is covered with the insulating coating 6. Thereafter, a metal such as silver, for example, is vapor-deposited over the entire surface of the semiconductor body to form a layer or web 8 having a thickness of about 6000 A. It will be understood that this metal is deposited in direct contact with the exposed surfaces of the underlying device regions through the openings in the protective insulating coating 6 and in effect has resulted in electrically connecting or shorting all such regions to each other.

Figure 2:
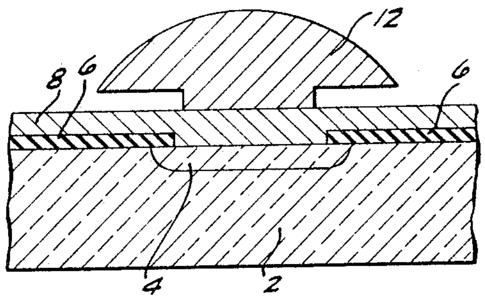

A layer 10 of an insulating and etch-resistant material known in the art as a photoresist is then formed over the metal web 6 and portions of the photoresist layer 10 are removed to expose portions of the underlying metal web 6 to which and whereat it is desired to form metallic electrical contacts or bumps 12. In the drawings, such a contact is shown as being formed in line with the now-filled opening to the P-type region 4, although it will be readily appreciated that the location of the electrical contact or bump 12 for this P-type region 4 is a matter of design choice and convenience and need not necessarily be disposed in alignment with the particular region for which the bump is intended to permit external electrical connection thereto. After the preselected portions of the metal web 8 are thus exposed as desired, the entire semiconductor body is immersed in an electroplating bath while utilizing the metal web 8 as the cathode connection in the plating circuit. The plating metal may be silver, for example. The plating web or layer 8 is thus used to provide the necessary electroplating connection to permit the simultaneous growth or formation of relatively large rugged electrical contact bumps such as the bump 12 shown in the drawings. As the bump grows during the plating process, it fills the opening in the plating mask layer 10 after which the bump continues to grow both vetrically to a height of about 3 mils, for example, and laterally so as to extend over the plating mask layer 10 around the opening therein to a corresponding distance. After the formation of bumps to the desired height, the semiconductor body is removed from the plating bath and portions of the plating mask or photoresist layer 10 surrounding and/or under the bump are removed by a simple etching procedure. Alternatively, the entire plating mask may be removed. Heretofore it was also customary to remove the metal web or layer 8 at the same time. Because of the lateral growth of the bump 12 over the surrounding photoresist layer 10, removal of this layer left a gap under the flange or overhang of the bump as best shown in FIGURE 2 although it will be appreciated that the gap formed would be even greater than that indicated in this figure due to the removal of the web 8 which is shown in this figure as still being in place.

Figure 3:
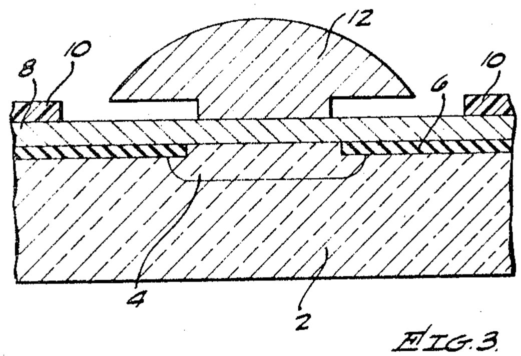
Figure 4:
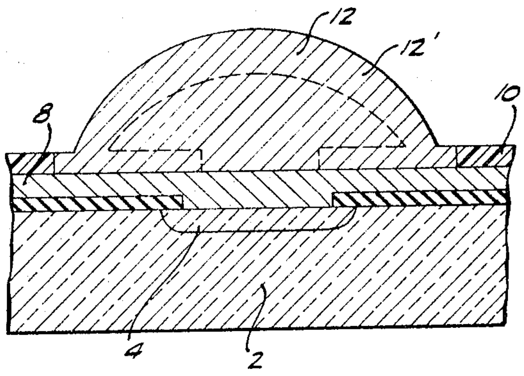

When it was desired to further effectively hermetically seal the bumps thus formed as by the application of additional insulating material such as glass, for example, it was found that the gap under the flange of the bumps made it very difficult, if not impossible, to achieve such sealing therearound. Therefore, in order to solve this problem, the metal web 8 utilized for plating or growing the bumps is not removed at this stage of fabrication but is retained as shown in FIGURE 2. If the entire plating mask has been removed, a new plating mask or layer 10′ of photoresist material is applied over the entire surface of the device and is selectively removed leaving a ring-like opening 13 therein surrounding each bump as shown in FIGURE 3. The width of the ring or opening may be from 0.0001″ to 0.001″, for example. Thereafter, the semiconductor body is returned to the electroplating bath and growing the bump 12 by plating metal thereon is continued as before and until the opening in the insulating mask 10′ is filled or at least until the gap under the overhang of the initially formed bump is filled with plated metal as shown in FIGURE 4. It should be noted that metal is plated on and grows upwardly from the plating web 8 at the peripheral portions thereof adjacent the second plating mask 10′ to form a bump 12′ having a flange 11 around the bump periphery. The additionally plated metal on the bump 12 is identified by reference numeral 12′ in the drawings. Though the additional plated metal is shown as a distinct region on the bump 12 and plating web, it will be appreciated that actually this newly plated metal will be indistinguishable from the initially formed bump 12.

Figure 5:
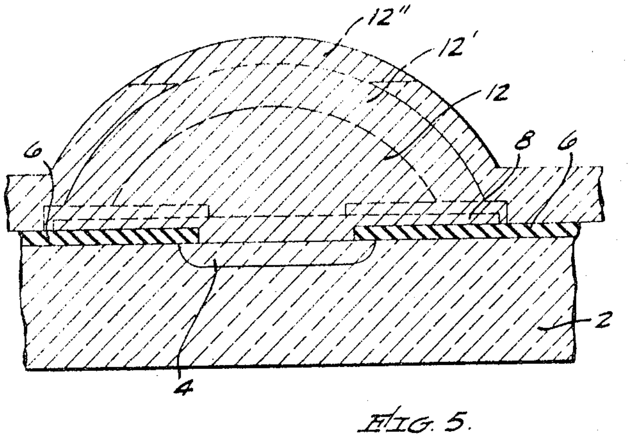

Fabrication of the component with the contact bump 12 is then completed by removal of the photoresist layer 10′ as by etching or dissolving the same. The plating web or layer 8 is also removed as by etching or by means of a high velocity water spray. Hermetically sealing and protecting the surface including the bump 12 may then be accomplished by applying or forming as by sputtering a layer 15 of glass over the surface of the device and the bump 12 as shown in FIGURE 5. The result is a device as shown in FIGURE 5 having a contact bump with no peripheral gap thereunder. The web metal portion 8 under the bump 12 remains and is indicated by dashed lines in the drawing although it will be understood that the metal of this layer 8 coalesces or is substantially integral with the bump 12. It may also be desirable to provide the bump 12 with an additional coating 12″ of solderable metal in order to facilitate the attaching of wires or the like thereto. This may be accomplished by covering the entire surface of the component with a coating of nonmetallic or insulating material which may be either permanently or temporarily bonded thereto while leaving the bumps protruding therethrough. The surface on which the bumps are exposed may then be partially immersed in a dip solder bath thus providing the bumps with a layer of solderable metal such as tin thereon.

What is claimed is:

1. The method of providing an electrical component with an electroplated electrical connection thereon comprising the steps of:

(a) depositing an electrically conductive coating over a surface of said electrical component including any electrically insulating and electrically conductive portions thereof;

(b) forming a mask of electrically nonconductive material over said electrically conductive coating and through which said mask at least one preselected portion of said electrically conductive coating is exposed;

(c) electroplating said preselected portion of said electrically conductive coating with a metal deposited through said mask by employing said electrically conductive coating as a plating electrode to form an electroplated metallic body on said preselected portion thereof;

(d) removing at least portions of said mask adjacent said electroplated metallic body to expose additional portions of said electrically conductive coating adjacent said electroplated metallic body;

(e) further electroplating said electroplated metallic body and said additionally exposed portions of said electrically conductive coating with metal by employing said electrically conductive coating as a plating electrode;

(f) and thereafter removing said mask and said electrically conductive coating thereunder.

2. The method of providing an electrical component with an electroplated electrical connection thereon comprising the steps of:

(a) depositing an electrically conductive coating over a surface of said electrical component including any electrically insulating and electrically conductive portions thereof;

(b) forming a mask of electrically nonconductive material over said electrically conductive coating and through which mask at least one preselected portion of said electrically conductive coating is exposed;

(c) electroplating said preselected portion of said electrically conductive coating with a metal deposited through said mask by employing said electrically conductive coating as a plating electrode to form an electroplated metallic body on said preselected portion thereof;

(d) removing at least portions of said mask adjacent said electroplated metallic body to expose additional portions of said electrically conductive coating adjacent said electroplated metallic body;

(e) further electroplating said electroplated metallic body and said additionally exposed portions of said eelctrically conductive coating with metal by employing said electrically conductive coating as a plating electrode;

(f) thereafter removing said mask and said electrically conductive coating thereunder;

(g) and applying an electrically insulating protective coating over said surface of said electrical component and around said electroplated metallic body.

3. The method according to claim 2 including the step of hermetically sealing said electrically insulating protective coating to said surface and to said electroplated metallic body.

4. The method according to claim 2 wherein said electrically insulating protective coating is glass.

5. The method of providing an electrical component with an electroplated electrical connection thereon comprising the steps of:

(a) depositing an electrically conductive coating over a surface of said electrical component including any electrically insulating and electrically conductive portions thereof;

(b) forming a mask of electrically nonconductive material over said electrically conductive coating and through which mask at least one preselected portion of said electrically conductive coating is exposed;

(c) electroplating said preselected portion of said electrically conductive coating with a metal deposited through said mask by employing said electrically conductive coating as a plating electrode to form an electroplated metallic body on said preselected portion thereof;

(d) removing at least portions of said mask adjacent said electroplated metallic body to expose additional portions of said electrically conductive coating adjacent said electroplated metallic body;

(e) covering portions of said additional exposed portions of said electrically conductive coating remote from said electroplated metallic body with an electrically nonconductive material;

(f) and further electroplating said electroplated metallic body and said additionally exposed portions of said electrically conductive coating with metal by employing said electrically conductive coating as a plating electrode.

6. The method according to claim 5 including the step of hermetically sealing said electrically insulating protective coating to said surface and to said electroplated metallic body.

7. The method according to claim 5 wherein said electrically insulating protective coating is glass.

8. The method of providing an electrical component with an electroplated electrical connection thereon comprising the steps of:

(a) depositing an electrically conductive coating over a surface of said electrical component including any electrically insulating and electrically conductive portions thereof;

(b) forming a mask of electrically nonconductive material over said electrically conductive coating and through which mask at least one preselected portion of said electrically conductive coating is exposed;

(c) electroplating said preselected portion of said electrically conductive coating with a metal deposited through said mask by employing said electrically conductive coating as a plating electrode to form an electroplated metallic body on said preselected portion thereof;

(d) removing at least portions of said mask adjacent said electroplated metallic body to expose additional portions of said electrically conductive coating adjacent said electroplated metallic body;

(e) covering portions of said additional exposed portions of said electrically conductive coating remote from said electroplated metallic body with an electrically nonconductive material;

(f) further electroplating said electroplated metallic body and said additionally exposed portions of said electrically conductive coating with metal by employing said electrically conductive coating as a plating electrode;

(g) and thereafter removing said mask and said electrically conductive coating thereunder.

9. The method of providing an electrical component with an electroplated electrical connection thereon comprising the steps of:

(a) depositing an electrically conductive coating over a surface of said electrical component including any electrically insulating and electrically conductive portions thereof;

(b) forming a mask of electrically nonconductive material over said electrically conductive coating and through which mask at least one preselected portion of said electrically conductive coating is exposed;

(c) electroplating said preselected portion of said electrically conductive coating with a metal deposited through said mask by employing said electrically conductive coating as a plating electrode to form an electroplated metallic body on said preselected portion thereof;

(d) removing at least portions of said mask adjacent said electroplated metallic body to expose additional portions of said electrically conductive coating adjacent said electroplated metallic body;

(e) covering portions of said additional exposed portions of said electrically conductive coating remote from said electroplated metallic body with an electrically nonconductive material;

(f) further electroplating said electroplated metallic body and said additionally exposed portions of said electrically conductive coating with metal by employing said electrically conductive coating as a plating electrode;

(g) thereafter removing said mask and said electrically conductive coating thereunder;

(h) and applying an electrically insulating protective coating over said surface of said electrical component and around said electroplated metallic body.

References Cited

UNITED STATES PATENTS

| | | | |
|---|---|---|---|
| 2,834,723 | 5/1958 | Robinson | 204—15 |
| 2,934,479 | 4/1960 | Deer | 204—15 |
| 3,208,921 | 9/1965 | Hill | 204—15 |
| 3,342,927 | 9/1967 | Kubik et al. | 204—15 |
| 3,375,418 | 3/1968 | Garnache et al. | 17—212 |

JOHN H. MACK, Primary Examiner

T. TUFARIELLO, Assistant Examiner

U.S. Cl. X.R.

204—38